United States Patent [19]
Shimizu

[11] Patent Number: 5,260,594
[45] Date of Patent: Nov. 9, 1993

[54] SEMICONDUCTOR DEVICE REDUCING INTERNAL NOISES AND INTEGRATED CIRCUIT EMPLOYING THE SAME

[75] Inventor: Shin Shimizu, Tokyo, Japan

[73] Assignee: Nippon Steel Corporation, Tokyo, Japan

[21] Appl. No.: 795,775

[22] Filed: Nov. 21, 1991

[30] Foreign Application Priority Data

Nov. 21, 1990 [JP] Japan .................. 2-319519

[51] Int. Cl.$^5$ .................. H01L 27/02; H01L 29/48; H01L 29/04; H01L 23/48
[52] U.S. Cl. .................. 257/368; 257/369; 257/377; 257/476; 257/73
[58] Field of Search .................. 357/15, 41, 42, 59, 357/90, 71, 368, 369, 377, 382, 476, 475, 73, 754

[56] References Cited

U.S. PATENT DOCUMENTS

| | | | |
|---|---|---|---|
| 4,300,152 | 11/1981 | Legselter | 357/38 |
| 4,513,309 | 4/1985 | Cricchi | 357/41 |
| 4,920,399 | 4/1990 | Hall | 357/42 |
| 5,061,981 | 10/1991 | Hall | 357/42 |

FOREIGN PATENT DOCUMENTS 57-188122 11/1982 Japan .

*Primary Examiner*—Mark V. Prenty
*Attorney, Agent, or Firm*—Pollock, Vande Sande & Priddy

[57] ABSTRACT

A semiconductor device of the present invention capable of obtaining a proper output signal by absorbing an overshoot or an undershoot to reduce internal noises, comprises, a logical circuit portion including a transistor, a first diode disposed between a power line and an electrode of the logical circuit portion communicating with a power supply with its cathode being directed to the power line, and a second diode disposed between a ground line and an electrode of the logical circuit portion communicating with the ground with its anode being directed to the ground line. Another semiconductor device of the present invention includes a MOS transistor. An electrode portion of the device communicating with the power line and that of the device communicating with the ground line are formed by restricting impurity concentration of semiconductor portions in contact with the associated metal electrodes and have diode effect. A semiconductor integrated circuit of the present invention is formed by integration the above semiconductor devices with reduced internal noises.

12 Claims, 3 Drawing Sheets

SEMICONDUCTOR DEVICE REDUCING INTERNAL NOISES AND INTEGRATED CIRCUIT EMPLOYING THE SAME

FIELD OF THE INVENTION

The present invention relates to a semiconductor device having a structure in which internal noises are reduced and more particularly to a semiconductor device suitable for construction of a MOS type integrated circuit.

BACKGROUND OF THE INVENTION

It has been required for a semiconductor integrated circuit to have a higher speed operation and a higher density integration as, in recent years, an electronic equipment applied to the semiconductor integrated circuit has been improved in performance. In order to fulfill such a request, it is necessary to solve a problem relating to noises generated in an integrated circuit.

It has been known to reduce internal noises, hitherto, there is known a procedure to employing a layout of an integrated circuit in which the internal noises are hardly generated because a distance between, signal lines is increased to prevent a crosstalk. It is also known to connect a relatively large capacity load to a signal line so as to prevent an overshoot or undershoot from being generated in the circuit.

Under present conditions, the procedure of obtaining a semiconductor integrated circuit in which the noise is hardly generated depends on a trial and error design of increasing the distance between the signal lines and of realizing a higher density integration. Even if a simulator of high accuracy is used, an optimal design of an integrated circuit is very difficult. Moreover, even if an optimally designed layout is prepared, there is a limit in reduction of the noises which are generated during the high speed operation of a high density integrated circuit.

The method of connecting the capacity load to the signal line to prevent the generation of the noise is not suitable for the high density integration since the capacitor is large in size.

JP-A-57-188122 (the term "JP-A" used herein means that the patent application was laid open to public inspection but has not been examined) by Inoue discloses a filter for eliminating high frequency noises by connecting a capacity load to a signal line to reduce internal noises. The filter of Inoue is formed in a package enclosing by-pass capacitors to be inserted between each terminal of a package of a dual-in-line type integrated circuit and the ground. The package has the same number of pins as that of the integrated circuit package. Moreover, the filter of Inoue is mounted in such a way as to be hierarchically superposed on the integrated circuit chip. The filter disclosed by Inoue is considerably small and is capable of being used integrally with the integrated circuit for reducing noises in the integrated circuit. Since the filter of Inoue has a size substantially equal to that of the integrated circuit, although it can be superposably mounted, it cannot sufficiently comply with the request for the higher density integration.

Moreover, in the case where for the purpose of further improving the integration, capacity elements are integrated in the semiconductor integrated circuit, a considerable area must be secured on the chip. Therefore, it is difficult to form a high density integrated circuit.

Incidentally, since the capacity elements cause a response speed to be lowered, this is contrary to the request for attainment of the higher speed operation.

SUMMARY OF THE INVENTION

In the light of the above problems, it is an object of the present invention to provide a novel semiconductor device capable of reducing noise and more particularly to provide an integrated semiconductor device for an integrated circuit of high density.

A semiconductor device according to the present invention comprises a logical circuit portion including transistors, a first diode and a second diode, the first diode being disposed between a power line and an electrode of the logical circuit portion communicating with a power supply, with its cathode being directed to the power line, the second diode being disposed between a ground line and an electrode of the logical circuit portion communicating with the ground, with its anode being directed to the ground line.

Moreover, a semiconductor device according to the present invention includes a MOS transistor. In this connection, an electrode portion of the device communicated with a power line and another electrode portion communicated with a ground line are formed by controlling respective impurity concentrations of semiconductor portions contacting the associated metal electrodes. As a result, the electrode portions formed of semiconductor material and metal have diode effect, known as so called Schottky effect.

Further, a semiconductor integrated circuit according to the present invention is formed by integrating the above-mentioned semiconductor devices.

In the semiconductor device according to the present invention, since diodes are provided between a semiconductor logical device and the power supply lines, an overshoot or an undershoot of a signal generated in the device may be immediately absorbed. As a result, it is possible to obtain a proper signal waveform. Since the semiconductor device of the present invention requires no additional impedance element for absorbing noises, response speed of the semiconductor device is not lowered.

Since a MOS transistor obtains diode function only by controlling the impurity concentration of semiconductor portion in the source region of the transistor, the MOS semiconductor device of the invention can be provided without increase of area size for forming the device by changing only some steps of the manufacturing process.

Furthermore, a MOS transistor employing polysilicon as a wiring communicating with the source may be provided with a diode function in electrode portions formed with polysilicon and metal by controlling the impurity concentration in the polysilicon portion. Therefore, the MOS semiconductor device of the present invention can be obtained by changing only some steps of the manufacturing process, without varying the size thereof.

Accordingly, it is possible to readily obtain a MOS integrated circuit generating significantly reduced overshoot and undershoot of a signal and complying with the request for a higher speed operation and a higher density integration.

DESCRIPTION OF THE PREFERRED EMBODIMENTS

Figure 1:
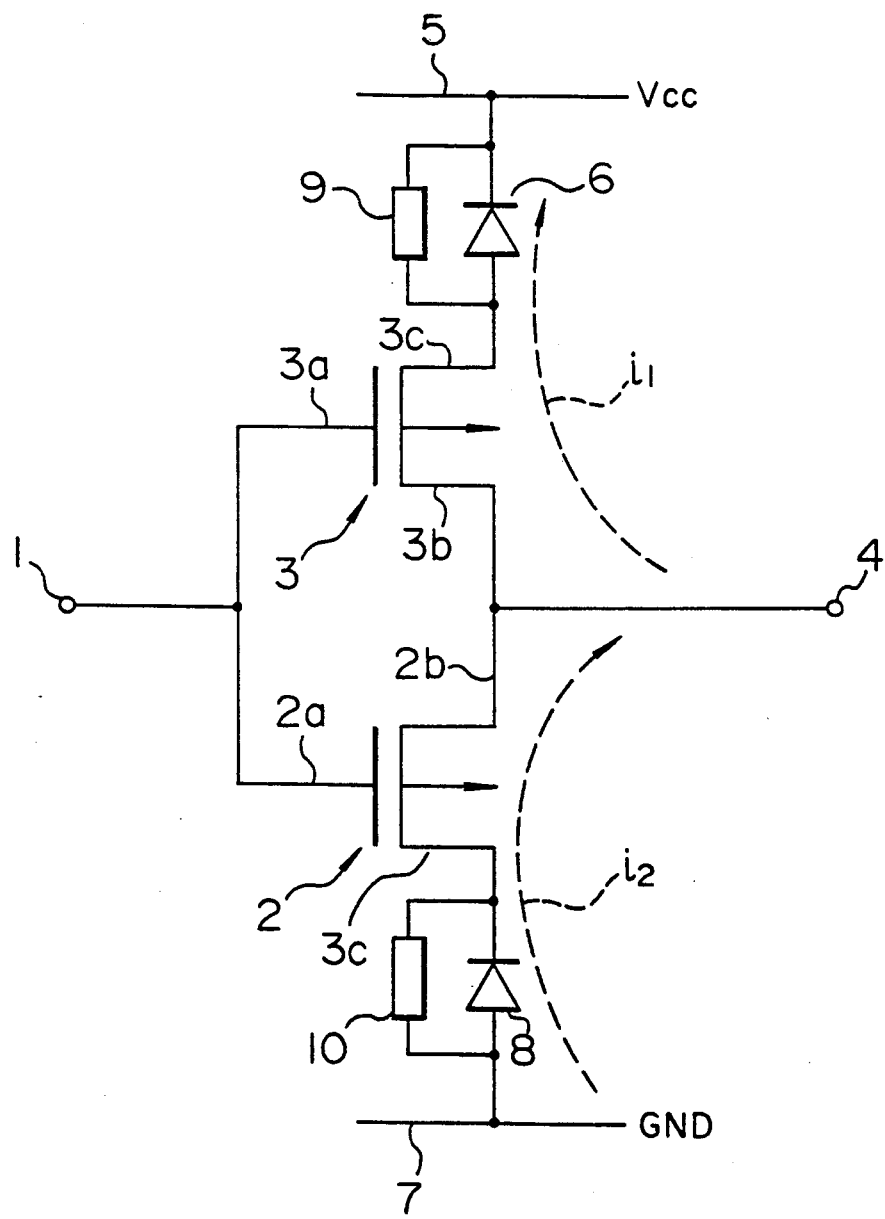
FIG. 1 is a conceptual diagram showing the arrangement of a portion of a semiconductor device of the present invention which is applied to an inverter circuit.
Figure 2:
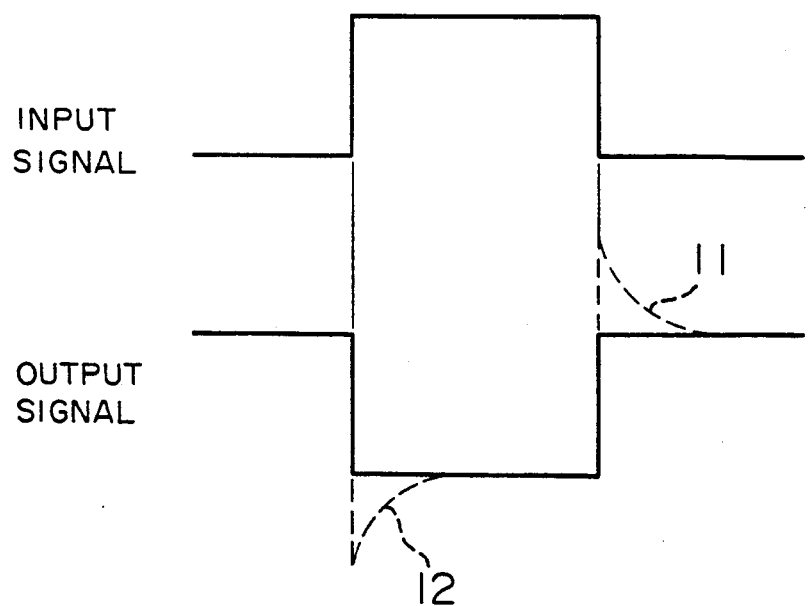
FIG. 2 is a waveform chart of an input and output signals in the inverter circuit shown in FIG. 1.

FIG. 1 is a conceptual diagram showing the arrangement of a semiconductor device of the present invention and explaining an example of an inverter circuit constructed by a complimentary MOS semiconductor device. FIG. 2 is a waveform chart of an input and output signals in the inverter circuit.

In FIG. 1, the reference numeral 1 designates an input terminal; 2 is an n-channel MOS transistor; 3 is a p-channel MOS transistor; 4 indicates an output terminal; 5 is a power line; 6 designates a diode; 7 is a ground line; 8 is a diode; 9 designates a resistor existing in a source region of the transistor 3; and 10 is a resistor existing in a source region of the transistor 2. Moreover, the reference numeral 2a designates a gate of the transistor 2; 2b is a drain of the transistor 2; 2c is a source of the transistor 2; 3a designates a gate of the MOS transistor 3; 3b is a drain of the MOS transistor 3; and 3c is a source of the MOS transistor 3. In FIG. 2, an upper figure shows an input waveform and a lower figure shows an output waveform. Moreover, the reference numeral 11 represents an overshoot, and the reference numeral 12 represents an undershoot. Broken lines $i_1$ and $i_2$ in FIG. 1 indicate currents generated during the overshoot and that generated during the undershoot, respectively.

The input terminal 1 of the inverter circuit is connected to the gates 2a and 3a of the both MOS transistors 2 and 3. The drain 2b of the n-channel MOS transistor 2 and the drain 3b of the p-channel MOS transistor 3 are connected to the output terminal 4. The power line 5 is supplied with a voltage Vcc. The diode 6 is connected between the power line 5 and the source 3c of the p-channel MOS transistor 3 with its cathode being directed to the power line 5. On the other hand, the diode 8 is connected between the ground line 7 connected to the earth GND and the source 2c of the n-channel MO transistor 2 with its cathode being directed to the source 2c. Incidentally, bulk resistors 9 and 10 due to semiconductor material are respectively present in parallel with the diodes 6 and 8 each of which is formed of semiconductor.

Based on the functions of the diodes formed as described above, when a rectangular pulse having the waveform as shown in the upper figure of FIG. 2 is inputted to the input terminal 1, a rectangular pulse of good response as represented by a solid line in the lower figure of FIG. 2, and free from the overshoot or undershoot, is outputted from the output terminal 4. That is, when a noise resulting in an overshoot 11 is generated, a current $i_1$ is caused to flow from the output terminal 4 to the power line 5 through the transistor 3 and the diode 6. Therefore, the overshoot 11 is prevented from being generated. On the other hand, when a noise resulting in an undershoot 12 is generated, a current $i_2$ is caused to flow from the ground line 7 to the output terminal 4 through the transistor 2 and the diode 8. Therefore, the undershoot 12 is prevented from being generated.

The output waveform thus obtained does not cause an abnormal operation such as a latch-up since the overshoot or undershoot is sufficiently suppressed.

Figure 3:
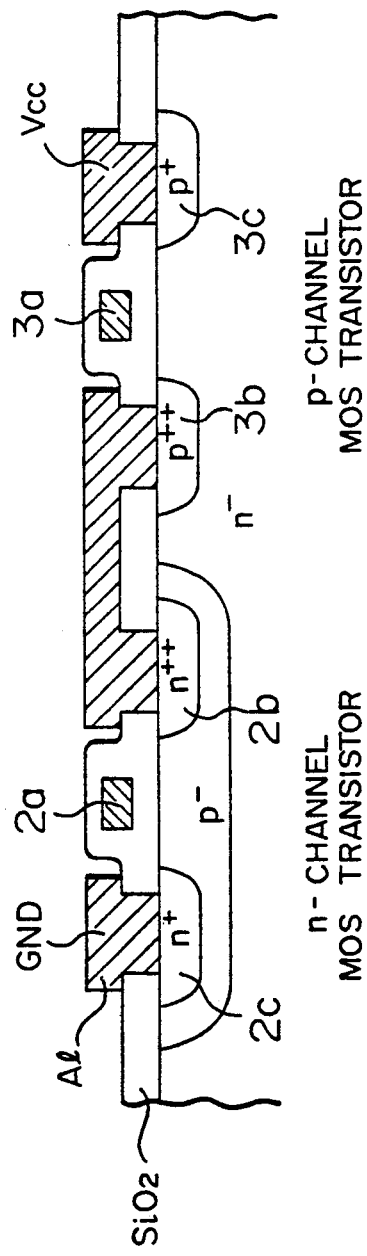
FIG. 3 is a cross sectional view showing the internal structure of a MOS transistor.

FIG. 3 is a cross sectional view showing the internal structure of a complimentary MOS semiconductor device according to the present invention.

A p-channel MOS transistor 3 is formed on a substrate of n-type. A region of a source 3c and that of a drain 3b are formed in aperture portions of an insulating layer made of an oxide film covering the substrate, respectively. In each of the aperture portions, a metal electrode is in contact with the substrate doped with p-type impurities.

An n-channel MOS transistor 2 is formed on a portion of an n-type substrate where the type of conducting is converted into p-type by doping with p-type impurities. In regions of a source 2c and a drain 2b which are formed in respective aperture portions of the oxide film insulating layer, metal electrodes are in contact with the substrate doped with n-type impurities.

The MOS semiconductor device as one embodiment of the present invention is constructed in such a way that the concentration of n-type impurities implanted into the region of the source 2c of the n-channel MOS transistor 2 is restricted to form a Schottky barrier structure between the source 2c and the metal electrode made of aluminium for example, and the concentration of p-type impurities implanted into the region of the source 3c of the p-channel MOS transistor 3 is restricted to form a Schottky barrier structure between the source and the metal electrode.

Since each of the Schottky barrier structure described above has a diode function and its parallel resistance in terms of an equivalent circuit, it has the same function as that of the parallel circuit consisting of the diode and the resistor shown in FIG. 1.

In order to form such a structure in each of the source areas, there is need for an additional process of implanting impurities to the areas with lower concentration than the concentration of the impurities implanted into the drain areas. However, no other difficult process is required.

Incidentally, in the present embodiment, the description has been given to the semiconductor device which is formed using an n-type substrate. However, it is needless to say that the semiconductor device may be formed similarly using a p-type substrate.

Figure 4:
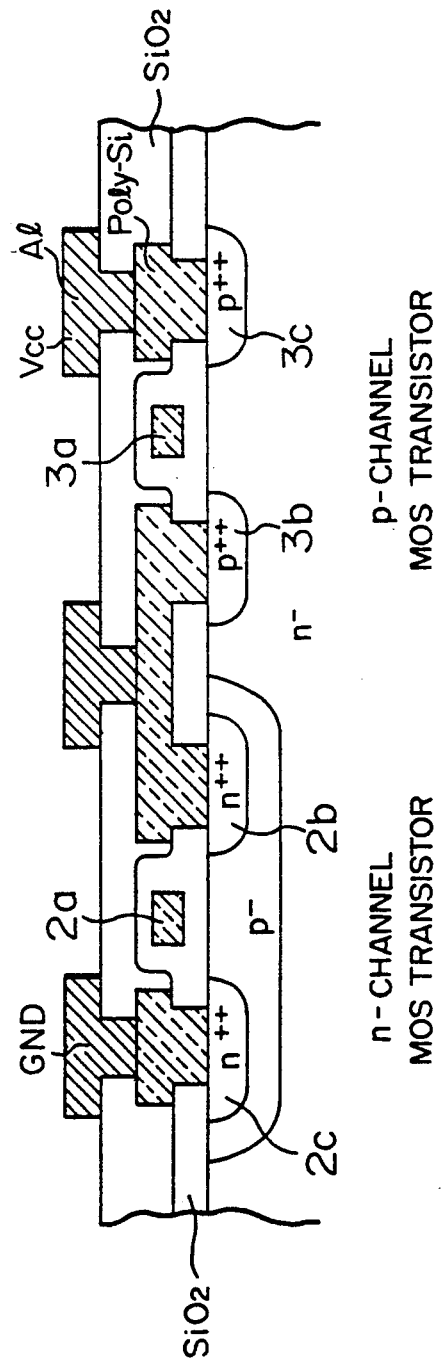
FIG. 4 is a cross sectional view showing the internal structure of another MOS transistor.

FIG. 4 is a cross sectional view showing the internal structure of a MOS semiconductor device according to another embodiment of the present invention.

The present device is a MOS semiconductor device wherein a conduit on the side of a source is formed of polysilicon and a metal electrode communicating with a power line or a ground line is connected to the conduit made of polysilicon. Such a structure is generally employed in the integrated circuit having a laminated structure. The semiconductor device of the present invention is constructed in such a way that instead of the restriction of the impurity concentration in the source area in the device as described on referring to FIG. 3, the impurity concentration of polysilicon in the source area is restricted to form a Schottky barrier diode between polysilicon and the metal electrode. It conforms to the present semiconductor device as well as the above-mentioned semiconductor device that in order to form such a structure, only some steps of the manufacturing process may be improved.

As set forth hereinabove, the semiconductor device of the present invention can be manufactured by adding simple manufacturing steps and it provides an output signal at a high speed suppressing the internal noise. Moreover, since the size of the device is not changed, when the semiconductor device of the present invention is utilized as a composing element of an integrated circuit, it is possible to obtain an integrated circuit of a high density integration with reduced noises.

We claim:

1. A semiconductor device to be connected between a power supply line and a ground line comprising:
   a logic portion including a plurality of MOS transistors; a first metallic conduit leading to the power supply line; and a second metallic conduit leading to the ground line;
   the logic portion having a first electrode area in communication with the power supply line, said first electrode area forming a source region of a first MOS transistor in said logic portion, and a second electrode being in communication with the ground line, said second electrode area forming a source region of a second MOS transistor in said logic portion;
   the first electrode area contacting the first metallic conduit, the area formed by doping with impurity material so as to obtain a diode function in cooperation with the first metallic conduit; and
   the second area contacting the second metallic conduit, the area being formed by doping with impurity material so as to obtain a diode function in cooperation with the second metallic conduit.

2. An integral circuit integrated with the semiconductor device claimed in claim 1.

3. A semiconductor device to be connected between a power supply line and a ground line comprising:
   a logic portion including a MOS transistors; a first metallic conduit leading to the power supply line; and a second metallic conduit leading to the ground line, wherein
   the logic portion has a first electrode area in communication with the power supply line and a second electrode area in communication with the ground line,
   the first electrode area covered with a first polysilicon conduit contacting the first metallic conduit, the first polysilicon conduit being doped with impurity material so as to obtain a diode function in cooperation with the first metallic conduit; and
   the second electrode area covered with a second polysilicon conduit contacting the second metallic conduit, the second polysilicon conduit being doped with impurity material so as to obtain a diode function in cooperation with the second metallic conduit.

4. An integral circuit integrated with the semiconductor device claimed in claim 3.

5. A semiconductor device to be connected between a power supply line and a ground line comprising:
   a logic portion including a first MOS transistor having a source electrode communicating with the power line and a second MOS transistor having a source electrode communicating with the ground line;
   the first diode having an anode and a cathode, and being connected to the source electrode of the first MOS transistor by the anode and to the power supply line by the cathode; and
   a second diode having an anode and a cathode, and being connected to the source electrode of the second MOS transistor by the cathode and to the ground line by the anode;
   wherein the power line includes a metallic conduit connected to the source electrode of the first MOS transistor; and
   wherein the source electrode of the first MOS transistor is formed by doping with impurity material so as to obtain a diode function in cooperation with the metallic conduit of the power supply line.

6. A semiconductor device according to claim 5, wherein each of the first and second MOS transistor has a drain electrode, the drain electrode of the first MOS transistor being connected to the drain electrode of the second MOS transistor.

7. A semiconductor device according to claim 5, wherein each of the first and second MOS transistors has a gate electrode, the gate electrode of the first MOS transistor being connected to the gate electrode of the second MOS transistor.

8. A semiconductor device according to claim 5, wherein the first MOS transistor is a p-channel MOS transistor, and the second MOS transistor is an n-channel MOS transistor.

9. A semiconductor device to be connected between a power supply line and a ground line comprising:
   a logic portion including a first MOS transistor having a source electrode communicating with the power line and a second MOS transistor having a source electrode communicating with the ground line;
   a first diode having an anode and a cathode, and being connected to the source electrode of the first MOS transistor by the anode and to the power supply line by the cathode; and
   a second diode having an anode and a cathode, and being connected to the source electrode of the second MOS transistor by the cathode and to the ground line by the anode;
   wherein the ground line includes a metallic conduit connected to the source electrode of the second MOS transistor; and
   wherein the source electrode of the second MOS transistor is formed by doping with impurity material so as to obtain a diode function in cooperation with the metallic conduit of the ground line.

10. A semiconductor device according to claim 9, wherein each of the first and second MOS transistors has a drain electrode, the drain electrode of the first MOS transistor being connected to the drain electrode of the second MOS transistor.

11. A semiconductor device according to claim 9, wherein each of the first and second MOS transistors has a gate electrode, the gate electrode of the first MOS transistor being connected to the gate electrode of the second MOS transistor.

12. A semiconductor device according to claim 9, wherein the first MOS transistor is a p-channel MOS transistor, and the second MOS transistor is an n-channel MOS transistor.

* * * * *